United States Patent
Liao et al.

(10) Patent No.: US 9,942,989 B2
(45) Date of Patent: *Apr. 10, 2018

(54) INSULATION FILM AND METHOD FOR MAKING INSULATION FILM

(71) Applicant: ILLINOIS TOOL WORKS, INC., Glenview, IL (US)

(72) Inventors: Hongchuan Liao, Shanghai (CN); Chris Benson, Addison, IL (US); Yong Liang, Shanghai (CN); Tom Carlson, Addison, IL (US)

(73) Assignee: ILLINOIS TOOL WORKS INC., Glenview, IL (US)

(*) Notice: Subject to any disclaimer, the term of this patent is extended or adjusted under 35 U.S.C. 154(b) by 286 days.

This patent is subject to a terminal disclaimer.

(21) Appl. No.: 14/312,222

(22) Filed: Jun. 23, 2014

(65) Prior Publication Data

US 2015/0373853 A1 Dec. 24, 2015

Related U.S. Application Data

(63) Continuation of application No. PCT/US2013/071341, filed on Nov. 21, 2013, and a
(Continued)

(51) Int. Cl.
*H05K 7/00* (2006.01)
*H05K 1/18* (2006.01)
(Continued)

(52) U.S. Cl.
CPC ............ *H05K 1/185* (2013.01); *B32B 27/08* (2013.01); *B32B 27/20* (2013.01); *B32B 27/32* (2013.01);
(Continued)

(58) Field of Classification Search
USPC .................. 361/761, 760; 428/480
See application file for complete search history.

(56) References Cited

U.S. PATENT DOCUMENTS

| | | | |
|---|---|---|---|
| 4,477,544 A | * | 10/1984 | Bruder .................... H01M 4/66 429/160 |
| 4,824,723 A | | 4/1989 | Campbell |

(Continued)

FOREIGN PATENT DOCUMENTS

| | | |
|---|---|---|
| CN | 1735508 A | 2/2006 |
| CN | 201889935 U | 7/2011 |

(Continued)

OTHER PUBLICATIONS

International Search Report for PCT/US2015/036133 dated Aug. 31, 2015, 4 pages.
(Continued)

*Primary Examiner* — Andargie M Aychillhum
(74) *Attorney, Agent, or Firm* — Klintworth & Rozenblat IP LLP

(57) ABSTRACT

The present invention provides an insulation film and a method for making the insulation film, comprising a film upper layer and a film lower layer, wherein both of the film upper layer and film lower layer are made of a heat conduction plastics material, the heat conduction plastics material contains a heat conduction additive; and a film intermediate layer located between the film upper layer and the film lower layer. The film intermediate layer is made of a heat conduction plastics material, and the heat conduction plastics material contains a conductive additive An upper surface of the film intermediate layer is bound together with a lower surface of the film upper layer, and a lower surface of the film intermediate layer is bound together with an upper surface of the film lower layer.

10 Claims, 7 Drawing Sheets

Related U.S. Application Data continuation of application No. PCT/US2013/071342, filed on Nov. 21, 2013, and a continuation of application No. PCT/US2013/071343, filed on Nov. 21, 2013.

(51) Int. Cl.

| | | |
|---|---|---|
| *B32B 27/08* | (2006.01) | |
| *B32B 27/20* | (2006.01) | |
| *B32B 27/32* | (2006.01) | |
| *B32B 27/34* | (2006.01) | |
| *B32B 27/36* | (2006.01) | |

(52) U.S. Cl.
CPC .............. *B32B 27/34* (2013.01); *B32B 27/36* (2013.01); *B32B 27/365* (2013.01); *B32B 2250/24* (2013.01); *B32B 2250/40* (2013.01); *B32B 2262/106* (2013.01); *B32B 2264/02* (2013.01); *B32B 2264/102* (2013.01); *B32B 2264/105* (2013.01); *B32B 2264/107* (2013.01); *B32B 2264/108* (2013.01); *B32B 2307/202* (2013.01); *B32B 2307/206* (2013.01); *B32B 2307/212* (2013.01); *B32B 2307/302* (2013.01); *B32B 2457/04* (2013.01); *H05K 2201/0137* (2013.01); *H05K 2201/0145* (2013.01); *H05K 2201/0154* (2013.01); *H05K 2201/0158* (2013.01); *H05K 2201/0183* (2013.01); *Y10T 428/31507* (2015.04); *Y10T 428/31681* (2015.04); *Y10T 428/31692* (2015.04); *Y10T 428/31721* (2015.04); *Y10T 428/31725* (2015.04); *Y10T 428/31728* (2015.04); *Y10T 428/31736* (2015.04); *Y10T 428/31757* (2015.04); *Y10T 428/31786* (2015.04); *Y10T 428/31797* (2015.04); *Y10T 428/31913* (2015.04)

(56) References Cited

U.S. PATENT DOCUMENTS

| | | | |
|---|---|---|---|
| 5,260,372 A | 11/1993 | Toporcer | |
| 6,276,104 B1 | 8/2001 | Long, Sr. | |
| 2002/0128358 A1 | 9/2002 | Murschall | |
| 2003/0114022 A1* | 6/2003 | Franzen | H01R 43/0221 439/67 |
| 2004/0066640 A1* | 4/2004 | Fujii | H01R 13/112 361/803 |
| 2004/0247819 A1 | 12/2004 | Khieu | |
| 2006/0011108 A1* | 1/2006 | Abu-Isa | B32B 27/18 108/57.25 |
| 2006/0110613 A1 | 5/2006 | Ye | |
| 2007/0014978 A1 | 1/2007 | Poloso | |
| 2007/0230156 A1 | 10/2007 | Chen | |
| 2009/0034054 A1 | 2/2009 | Ikegami | |
| 2010/0096181 A1 | 4/2010 | Nakamura et al. | |
| 2010/0282488 A1* | 11/2010 | Zheng | B32B 27/08 174/110 SR |
| 2011/0236662 A1 | 9/2011 | Fukuda | |

FOREIGN PATENT DOCUMENTS

| | | | |
|---|---|---|---|
| CN | 102171773 A | 8/2011 | |
| CN | 103550864 A | 2/2014 | |
| DE | 40 38 827 A1 | 6/1992 | |
| EP | 0248208 A2 | 12/1987 | |
| EP | 0377513 A2 | 7/1990 | |
| EP | 0 795 399 A1 | 9/1997 | |
| JP | H06 79846 A | 3/1994 | |
| JP | 2005-335101 A | 12/2005 | |
| JP | 2007146049 A1 | 6/2007 | |
| JP | 2010278293 | 12/2010 | |
| JP | 2011052094 | * 3/2011 | ............ B32B 27/18 |
| WO | 2011/148330 A1 | 12/2011 | |

OTHER PUBLICATIONS

International Search Report for PCT/US2013/071341 dated Feb. 25, 2014, 5 pages.
International Search Report for PCT/US2013/071342, dated Feb. 25, 2014, 5 pages.
International Search Report for PCT/US2013/071343, dated Feb. 25, 2014, 5 pages.

* cited by examiner

INSULATION FILM AND METHOD FOR MAKING INSULATION FILM

CROSS-REFERENCE TO RELATED APPLICATIONS

The present application is a continuation of and claims the benefit of priority from PCT International Patent Application Nos. PCT/US2013/071341, filed November 21, 2013, PCT/US2013/071342, filed Nov. 21, 2013, and PCT/US2013/071343, filed Nov. 21, 2013, the contents of all of these International Applications are incorporated by reference herein in their entireties.

FIELD OF THE INVENTION

The present invention relates to an insulation film.

BACKGROUND OF THE INVENTION

An insulation film is used to isolate various electronic devices or components to avoid malfunction caused by short circuiting, breakdown or the like between the electronic devices or components, or electronic elements in the electronic devices or components, and reduce the risk of catching fire of the electronic devices or components so as to guarantee normal operation of various electronic elements. For example, the insulation film is placed between a printed circuit board (PCB) containing various circuits and a metallic housing such as an aluminum or copper housing for preventing EMI (electromagnetic interference) to prevent problems such as short circuiting caused by contact between the various elements on the PCB and the metallic housing. In order to use the insulation film, the insulation film is required to have different operating properties. Furthermore, specific indices for the requirements for these properties of the insulation film vary with different requirements for insulation.

Therefore, it is desired to provide an insulation film which is produced at a lower cost, and exhibits better properties.

SUMMARY OF THE INVENTION

The present invention provides an insulation film, comprising a film upper layer, a film intermediate layer and a film lower layer, wherein the film upper layer and the film lower layer are made of heat conduction plastics, the heat conduction plastics contain plastics (such as PC, PET, PI, PP, PA, and so forth) and heat conduction additives (such as carborundum, boron nitride, metal oxide, and so forth) to meet the insulativity and thermal conductivity; and the film intermediate layer located between the film upper layer and the film lower layer. Wherein the film intermediate layer is made of plastics (such as PC, PET, PI, PP, PA, and so forth) and conductive additives (such as carbon black, carbon fiber, metal powder, conducting polymer, and so forth) to meet the electrical conductivity, thermal conductivity and mechanical toughness. An upper surface of the film intermediate layer is bound together with a lower surface of the film upper layer, a lower surface of the film intermediate is bound together with an upper surface of the film lower layer.

The present invention further provides an insulation film, comprising a film upper layer and a film lower layer, wherein the film upper layer is made of heat conduction plastics, the heat conduction plastics contain plastics (such as PC, PET, PI, PP, PA, and so forth) and heat conduction additives (such as carborundum, boron nitride, metal oxide, and so forth) to meet the insulativity and thermal conductivity; and the film lower is made of plastics (such as PC, PET, PI, PP, PA, and so forth) and conductive additives (such as carbon black, carbon fiber, metal powder, conducting polymer, and so forth) to meet the electrical conductivity, thermal conductivity and mechanical toughness. A lower surface of the film upper layer is bound together with an upper surface of the film lower layer.

DETAILED DESCRIPTION OF PREFERRED EMBODIMENTS

Figure 1:
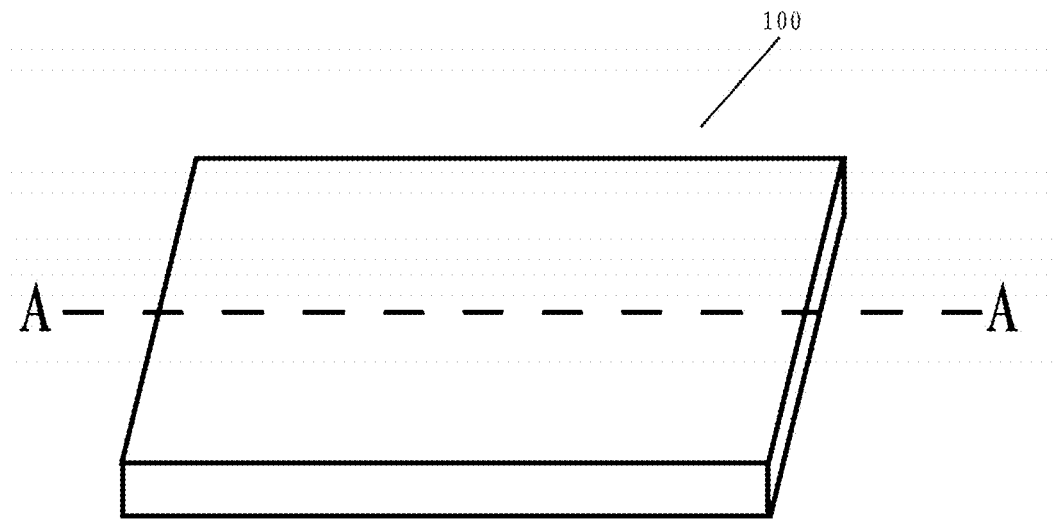
FIG. 1 is a schematic view of the insulation film according to an embodiment of the present invention.
Figure 2:
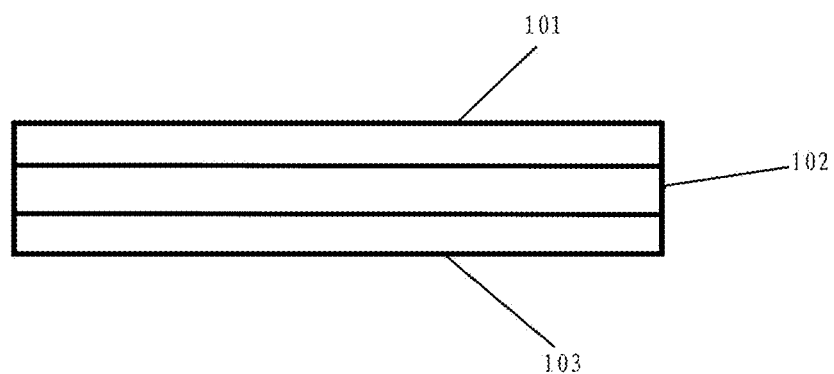
FIG. 2 is a cross-sectional view of the insulation film of FIG. 1 taken along the line A-A in FIG. 1.

FIG. 1 illustrates a schematic view of an insulation film 100 according to an embodiment of the present invention. According to one embodiment of the present invention, the insulation film 100 can have a thickness of 0.05 mm-3.0 mm. FIG. 2 is a cross-sectional view of the insulation film 100 of FIG. 1 taken along the line A-A in FIG. 1. As shown in FIG. 2, the insulation film 100 comprises an upper layer 101, an intermediate layer 102 and a lower layer 103.

The upper layer 101 and the lower layer 103 of the insulation film 100 are made of insulation material, the insulation material can be plastics (such as PC, PET, PI, PP, PA, and so forth) containing heat conduction additives (such as carborundum, boron nitride, metal oxide, and so forth) to provide insulation and thermal conductivity. The intermediate layer 102 of the insulation film 100 located between the upper layer 101 and the lower layer 103 of the insulation film 100 is made of plastics (such as PC, PET, PI, PP, PA, and so forth) and conductive additives (such as carbon black, carbon fiber, metal powder, and conducting polymer, and so forth) to meet the electrical conductivity, thermal conductivity and mechanical toughness. An upper surface of the film intermediate layer 102 is bound together with a lower surface of the film upper layer 101, a lower surface of the film intermediate layer 102 is bound together with an upper surface of the film lower layer 103.

An ordinary insulation material is not heat-conducting. Though a heat-conducting insulation film coated with thermally conductive adhesive has been presented in current market to increase the thermal conductivity, it usually can only be used as an interface heat conduction insulation material (the contact surface of different material is called an interface; the interface heat conduction insulation material is the heat conduction insulation material that needs the contact of surfaces, e.g., the interface heat conduction insulation material between the surfaces of electronic components and the surfaces of cooling fins), for the reason that the mechanical property of the adhesive is not good and the adhesive is sticky, and it is not convenient to use. In addition, the withstand voltage (or the breakdown voltage) is low. The heat conduction insulation film without adhesive is usually a thermoplastics material after modification, but the heat conduction of thermoplastics is usually crisp, not impact resistance and not resistant to fold, and thus cannot be made to a sheet film with a certain thinness (e.g., 0.2~0.8 mm) to conveniently use. When the present product requires the property of non-surface heat conduction insulation, it can be made to meet the usage requirements only by increasing the number of metal cooling fins and improving the grade of heat resistance of the components. However that leads to a higher product cost.

The insulation film 100 of the present invention has the following advantages:

(1) The conductive material of the intermediate layer of the insulation film in the present invention uses a material that is of good mechanical toughness, or modified to increase toughness, so that crisp heat conduction insulation material can be attached to the intermediate layer material of good mechanical toughness, and decrease the possibility of embrittlement of the surface layer. Thus the material can meet the requirement of punching and folding or the like processing as a whole;

(2) the conductive material (its thickness can be as low as 0.03 mm) of the intermediate layer in the invention is used for shielding the electromagnetic radiation and integrally has a certain mechanical strength to be formed, so that it can replace the thicker metal sheets in the present electrical products used by the customers and thus makes it convenient to design and reduces the cost for the customers;

(3) because the intermediate layer also is of good thermal conductivity as the upper layer and the lower layer, the material is of good thermal conductivity (thermal coefficient is as high as 2.0 W/(m·K)). In addition, the insulation film in the present invention has all the functions of insulation, thermal conductivity and shielding the electromagnetic radiation.

To a person skilled in the art, it is not easy (or obvious) to think of adding conductive additives (or materials) into an insulation film because an insulation film is traditionally used to perform insulation function between or among electronic components.

Through long-term observation, it was noticed that products using insulation material (e.g., the power adapter of a laptop) are required to be used inside some electrical products, while electrical circuit boards are needed to be surrounded by metal sheets to shield the electromagnetic radiation. These metal sheets are often thicker, approximately 0.3 mm~0.6 mm, to meet the product requirement (e.g., heat dissipation and strength requirement). Using the insulation film in the present invention to process insulating parts can omit the metal sheets inside the electrical products, but still retain the functions of heat dissipation and shielding the electromagnetic radiation. Compared with the present invention, traditional electronic products not only need more metal sheets to achieve the functions of heat dissipation and shielding the electromagnetic radiation, but also make it more complicated to be processed (for example, the metal sheets and insulating parts needed to be respectively punched, folded, assembled to surround the electrical circuit boards) with a higher process cost and greater odds of defective products.

Furthermore, it was found that the current regulatory standards (e.g., the international standard UL-60950 or IEC-60950) for the insulation film requires at least a thickness of 0.4 mm for a single-layered insulation film made of a homogeneous material if supplementary insulation or reinforced insulation is required for the single-layered insulation film. However, the UL standard does not impose such requirement of thickness for a multi-layered insulation film comprising inseparable layers. The UL standard requires the voltage resistance of the multi-layered insulation film comprising inseparable layers to increase by 50%-100% and requires the multi-layered insulation film comprising inseparable layers to pass the additional Mandrel test. That is to say, even if a multi-layered insulation film comprising inseparable layers has a thickness of less than 0.4 mm, it is considered as meeting the regulatory standards so long as it passes the stricter voltage withstanding test and the additional Mandrel test. The insulation film of the present invention is a multi-layered insulation film having inseparable multiple layers which are made of different materials, and it is found after experiments that the material for the insulation film of the present invention can exactly pass the stricter voltage withstanding test and the additional Mandrel test. Therefore, to meet the requirement under the regulatory standards, the thickness of the insulation film may be less than 0.4 mm. In other words, as compared with the conventional single-layered insulation film, the insulation film according to the present invention has a reduced thickness, for example, the thickness of the insulation film can be reduced from 0.43 mm to 0.25 mm or thinner, while the insulation film according to the present invention can pass the stricter voltage withstanding test and the additional Mandrel test, thereby saving the material and cutting the production costs.

Figure 3:
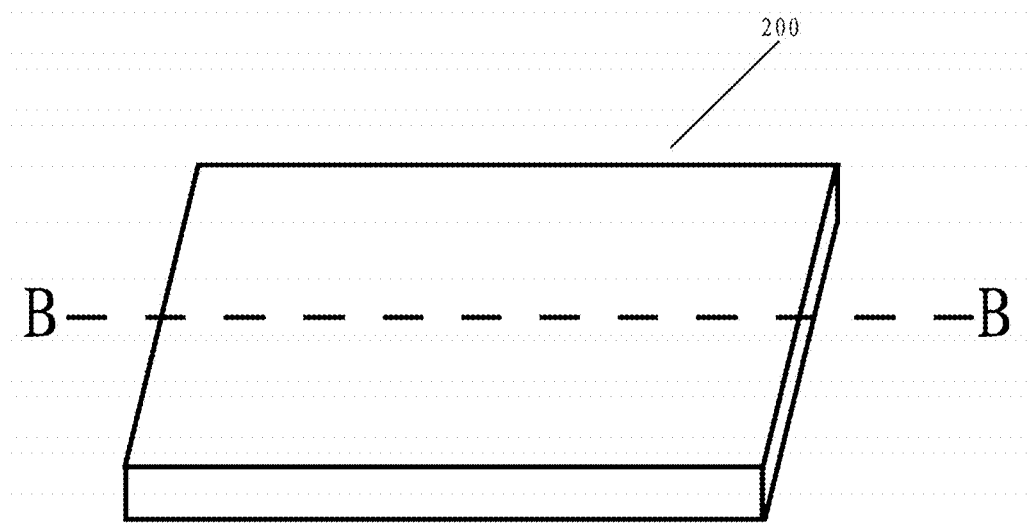
FIG. 3 is a schematic view of the insulation film according to another embodiment of the present invention.
Figure 4:
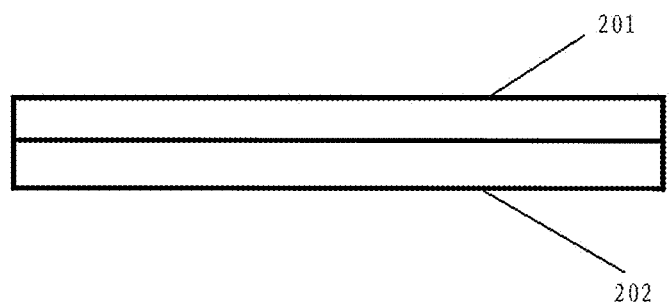
FIG. 4 is a cross-sectional view of the insulation film of FIG. 3 taken along the line B-B in FIG. 3.

FIG. 3 is a schematic view of a film 200 according to another embodiment of the present invention. The only difference between the insulation film 200 and the insulation film 100 in FIG. 1 lies in that the insulation film 200 has a structure of two layers. Wherein the first layer 201 of the insulation film 200 in FIG. 2 is made of the same material as used by the first layer 101 of the insulation film 100 in FIG. 1; the second layer 202 of the insulation film 200 in FIG. 2 is made of the same material as used by the second layer 102 of the insulation film 100 in FIG. 1.

Figure 5:
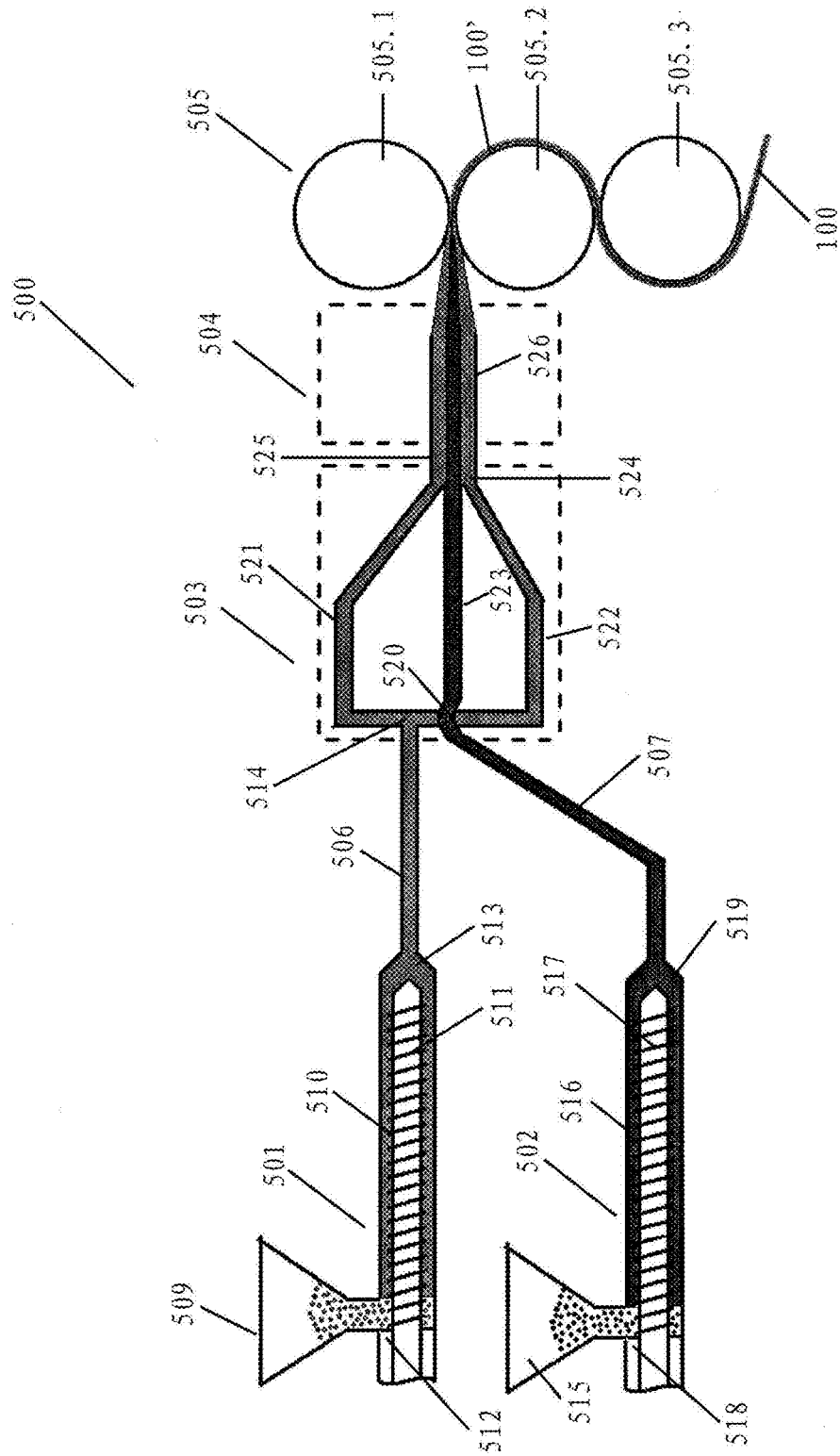
FIG. 5 is an exemplary view of a co-extruding process for producing the insulation film according to an embodiment of the present invention.

FIG. 5 illustrates a co-extruding assembly line 500 of a co-extruding process for producing the insulation film 100 according to an embodiment of the present invention. As shown in FIG. 5, the co-extruding assembly line 500 comprises a first extruder 501 and a second extruder 502. The first extruder 501 comprises a feeding hopper 509 and a receiving cavity 510. The feeding hopper 509 is configured to receive plastics (such as PC, PET, PI, PP, PA or the like) particles containing the heat conduction additives (such as carborundum, boron nitride, metal oxide, and so forth). The receiving cavity 510 is provided with a driving screw 511. An outlet of the feeding hopper 509 is communicated with a front end inlet 512 of the receiving cavity 510, a rear end outlet 513 of the receiving cavity 510 is communicated with an inlet of a pipe 506, and an outlet of the pipe 506 is communicated with a first inlet 514 of a dispenser 503. The second extruder 502 comprises a feeding hopper 515 and a receiving cavity 516. The feeding hopper 515 is configured to receive the plastics (such as PC, PET, PI, PP, PA, and so forth) containing conductive additives (such as carbon black, carbon fiber, metal powder, conducting polymer, and so forth). The receiving cavity 516 is provided with a driving screw 517. An outlet of the feeding hopper 515 is communicated with a front end inlet 518 of the receiving cavity 516, a rear end outlet 519 of the receiving cavity 516 is communicated with an inlet of a pipe 507, and an outlet of the pipe 507 is communicated with a second inlet 520 of the dispenser 503.

The first inlet 514 of the dispenser 503 is communicated with an inlet of a first branch line 521 and an inlet of the second branch line 522 of the dispenser, and the second inlet 520 of the dispenser 503 is communicated with an inlet of a third branch line 523 of the dispenser. As shown in FIG. 5, the third branch line 523 is located between the first branch line 521 and the second branch line 522. An outlet of the first branch line 521, an outlet of the second branch line 522 and an outlet of the third branch line 523 converge at an outlet 524 of the dispenser. The outlet 524 of the dispenser is connected to an inlet of a conduit 525, and an outlet of the conduit 525 is communicated with an inlet of a die cavity 526 of a die head 504. The die cavity 526 of the die head 504 has an appropriate width and depth so that the die cavity is sufficient to receive a material delivered from the pipe of the dispenser, and the die cavity 526 is flat so that the material delivered from the pipe of the dispenser is die pressed into a flat shape therein. The die pressed material is delivered through an outlet of the die cavity 526 to a forming roller apparatus 505. The forming roller apparatus 505 comprises a plurality of forming rollers placed adjacent to one another. The material delivered from the die cavity of the die head to the forming roller apparatus is stretched, roll pressed and cooled between the plurality of forming rollers to achieve a desired thickness and form a sheet material. FIG. 5 shows three such forming rollers 505.1, 505.2 and 505.3. Two or more forming rollers may be used in other embodiments.

According to the co-extruding assembly line 500 shown in FIG. 5, the insulation film 100 according to the present invention is produced in the following procedure.

During production, the receiving cavities 510 and 516 of the first extruder 501 and the second extruder 502 are heated, and the driving screws 511 and 517 of the first extruder 501 and the second extruder 502 are rotated. The plastics (such as PC, PET, PI, PP, PA or the like) particles containing the heat conduction additives (such as carborundum, boron nitride, metal oxide, etc.) are fed to the feeding hopper 509 of the first extruder 501. The rotation of the driving screw 511 of the first extruder 501 pushes the plastics particles containing the heat conduction additives in the feeding hopper 509 into the receiving cavity 510. Since the receiving cavity 510 is heated, the plastics particles containing the heat conduction additives, after entry into the receiving cavity 510, are melted due to heat generated from friction and are in a molten state. Affected by the pushing force generated by rotation of the driving screw 511, the plastics containing the heat conduction additives in the molten state is delivered to the rear end outlet 513 of the receiving cavity 510. The pushing force generated by rotation of the driving screw 511 enables the plastics containing the heat conduction additives in the molten state to flow out of the receiving cavity 510 from the rear end outlet 513 of the receiving cavity 510, and then enters the pipe 506 through the inlet of the pipe 506 communicated with the rear end outlet 513 of the receiving cavity 510. The plastics containing the heat conduction additives in the molten state flows out through the outlet of the pipe 506 to the first inlet 514 of the dispenser 503. At the inlet 514 of the dispenser, the plastics containing the heat conduction additives in the molten state is divided into two flows: one enters the first branch line 521 of the dispenser to become a first molten plastics containing heat conduction additives, and the other enters the second branch line 522 of the dispenser to become a second molten plastics containing heat conduction additives.

Similarly, the plastics (such as PC, PET, PI, PP, PA, etc.) particles containing conductive additives (such as carbon black, carbon fiber, metal powder, conducting polymer etc.) are fed to the feeding hopper 515 of the second extruder 502. The rotation of the driving screw 517 of the second extruder 502 pushes the plastics particles containing conductive additives in the feeding hopper 515 into the receiving cavity 516. Since the receiving cavity 516 is heated, the plastics particles containing conductive additives, after entry into the receiving cavity 516, are melted due to heat generated from friction and are in a molten state. Affected by the pushing force generated by rotation of the driving screw 517, the plastics containing conductive additives in the molten state is delivered to the rear end outlet 519 of the receiving cavity 516. The pushing force generated by rotation of the driving screw 517 enables the plastics containing conductive additives in the molten state to flow out of the receiving cavity 516 from the rear end outlet 519 of the receiving cavity 516, and then enters the pipe 507 through the inlet of the pipe 507 communicated with the rear end outlet 519 of the receiving cavity 516. The plastics containing conductive additives in the molten state flows out through the outlet of the pipe 507 to the second inlet 520 of the dispenser 503, and enters the third branch line 523 of the dispenser via the second inlet 503. Noticeably, the operation for the plastics particles containing conductive additives is performed at the same time as the previously-described operation for the plastics particles containing conductive additives The first molten plastics containing heat conduction additives entering the first branch line 521 of the dispenser 503, the plastics containing conductive additives in the molten state entering the third branch line 523 of the dispenser 503 and the second molten plastics containing heat conduction additives entering the second branch line 522 of the dispenser 503 converge at the outlet 524 of the dispenser to thereby superimpose together, and then enters the die cavity 526 of the die head 504 via the conduit 525 communicated with the outlet 524 of the dispenser so that the molten PP is die pressed in the die cavity 526 to form a flat molten mass. The die pressed flat molten mass is delivered to between the forming rollers 505.1 and 505.2 to receive a stretching and pressing force applied by the forming rollers 505.1 and 505.2 thereto, and meanwhile it is cooled by the forming rollers 505.1 and 505.2 to thereby form a sheet or film 100' with a predetermined thickness. The film 100' continued to be fed between the forming rollers 505.2 and 505.3 for further cooling or annealing to form the insulation film or sheet 100 according to one embodiment of the present invention. As needed, the die pressed flat molten mass outputted from the die head may run through only two forming rollers or more than two forming rollers to form the film.

Figure 6:
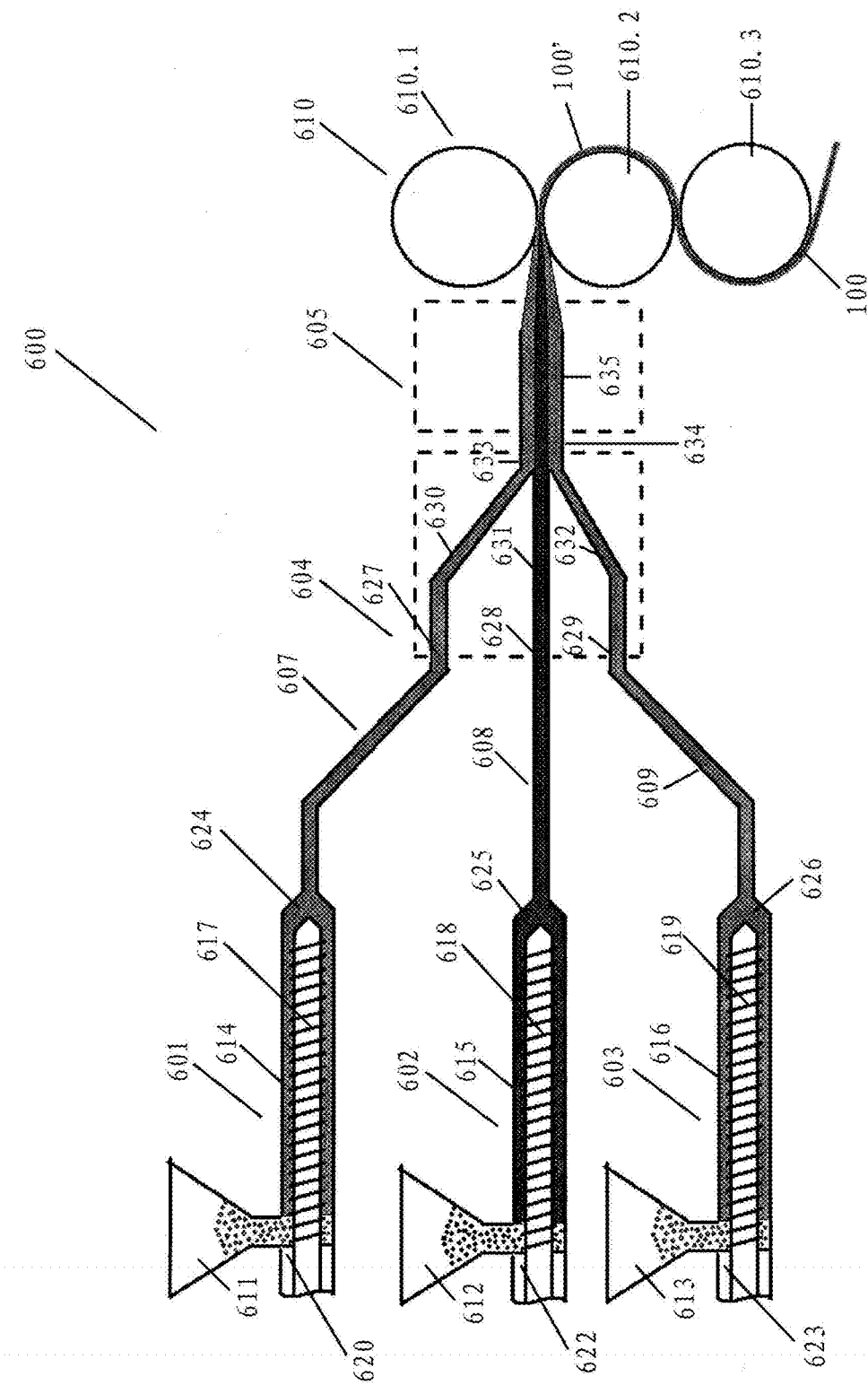
FIG. 6 is an exemplary view of another co-extruding process for producing the insulation film according to an embodiment of the present invention.

FIG. 6 illustrates a co-extruding assembly line 600 of another co-extruding process for producing the insulation film 100 according to an embodiment of the present invention. As shown in FIG. 6, the co-extruding assembly line 600 comprises a first extruder 601, a second extruder 602 and a third extruder 603. The first extruder 601, the second extruder 602 and the third extruder 603 respectively comprise a feeding hopper 611, 612, 613, a receiving cavity 614, 615, 616 and a driving screw 617, 618 and 619. The feeding hoppers of the first and third extruders 611 and 613 are configured to receive plastics (such as PC, PI, PP, PA, etc.) particles containing the heat conduction additives (such as carborundum, boron nitride, metal oxide, etc.). The feeding hopper of the second extruder 612 is configured to receive the plastics (such as PC, PET, PI, PP, PA, etc.) particles containing conductive additives (such as carbon black, carbon fiber, metal powder, conducting polymer, etc.). An outlet of the feeding hopper 611 of the first extruder 601 is communicated with a front end inlet 620 of the receiving cavity 614, a rear end outlet 624 of the receiving cavity 614 is communicated with an inlet of a pipe 607, and an outlet of the pipe 607 is communicated with a first inlet 627 of a dispenser 604. Similarly, an outlet of the feeding hopper 612 of the second extruder 602 is communicated with a front end inlet 622 of the receiving cavity 615, a rear end outlet 625 of the receiving cavity 615 is communicated with an inlet of a pipe 608, and an outlet of the pipe 608 is communicated with a second inlet 628 of the dispenser 604. An outlet of the feeding hopper 613 of the third extruder 603 is communicated with a front end inlet 623 of the receiving cavity 616, a rear end outlet 626 of the receiving cavity 616 is communicated with an inlet of a pipe 609, and an outlet of the pipe 609 is communicated with a third inlet 629 of the dispenser 604.

The first inlet 627 of the dispenser 604 is communicated with an inlet of a first branch line 630 of the dispenser, a second inlet 628 of the dispenser 604 is communicated with an inlet of a second branch line 631 of the dispenser, and a third inlet 629 of the dispenser 604 is communicated with an inlet of the of the third branch line 632 of the dispenser. As shown in FIG. 6, the second branch line 631 is located between the first branch line 630 and the third branch line 623. An outlet of the first branch line 630, an outlet of the second branch line 631 and an outlet of the third branch line 632 converge at an outlet 633 of the dispenser. The outlet 633 of the dispenser is communicated with an inlet of a conduit 634, and an outlet of the conduit 634 is communicated with an inlet of a die cavity 635 of a die head 605. The die cavity 635 of the die head 605 has an appropriate width and depth so that the die cavity is sufficient to receive a material delivered from the pipe of the dispenser, and the die cavity 635 is flat so that the material delivered from the pipe of the dispenser is die pressed into a flat shape therein. The die pressed material is delivered through an outlet of the die cavity 635 to a forming roller apparatus 610. The forming roller apparatus 610 comprises a plurality of forming rollers placed adjacent to one another. The material delivered from the die cavity of the die head to the forming roller apparatus is stretched, roll pressed and cooled between the plurality of forming rollers to achieve a desired thickness and form a sheet material. FIG. 6 shows three such forming rollers 610.1, 610.2 and 610.3. Two or more forming rollers may be used in other embodiments.

According to the co-extruding assembly line 600 shown in FIG. 6, the insulation film 100 according to the present invention is produced in the following procedure:

During production, the receiving cavities 614, 615 and 616 of the first extruder 601, the second extruder 602 and the third extruder 603 are heated, and the driving screws 617, 618 and 619 of the first extruder 601, the second extruder 602 and the third extruder 603 are rotated.

The plastics (such as PC, PET, PI, PP PA, etc.) particles containing the heat conduction additives (such as carborundum, boron nitride, metal oxide, etc.) are fed to the feeding hopper 611 of the first extruder 601. The rotation of the driving screw 617 of the first extruder 601 pushes the plastics particles containing the heat conduction additives in the feeding hopper 611 into the receiving cavity 614. Since the receiving cavity 614 is heated, the plastics particles containing the heat conduction additives, after entry into the receiving cavity 614, are melted due to heat generated from friction and are in a molten state. Affected by the pushing force generated by rotation of the driving screw 617, the plastics containing the heat conduction additives in the molten state is delivered to the rear end outlet 624 of the receiving cavity 614. The pushing force generated by rotation of the driving screw 617 enables the plastics containing the heat conduction additives in the molten state to flow out of the receiving cavity 614 from the rear end outlet 624 of the receiving cavity 614, and then enters the pipe 607 through the inlet of the pipe 607 communicated with the rear end outlet 624 of the receiving cavity 614. The plastics containing the heat conduction additives in the molten state flows out through the outlet of the pipe 607 to the first inlet 627 of the dispenser 604, and enters the first branch line 630 of the dispenser 604. The plastics particles containing the heat conduction additives entering the first branch line 630 of the dispenser 604 is a first molten plastics containing the heat conduction additives.

Similarly, the plastics particles containing the heat conduction additives are fed to the feeding hopper 613 of the third extruder 603. The plastics particles containing the heat conduction additives are delivered into the third branch line 632 of the dispenser 604 in the same manner as plastics particles containing the heat conduction additives in the feeding hopper 611 of the first extruder 601, and the plastics particles containing the heat conduction additives entering the third branch line 632 of the dispenser 604 is a second molten plastics containing the heat conduction additives.

The plastics (such as PC, PET, PI, PP, PA, etc.) particles containing the conductive additives (such as carbon black, carbon fiber, metal powder, conducting polymer, etc.) are fed to the feeding hopper 612 of the second extruder 602. The plastics particles containing conductive additives are delivered into the second branch line 631 of the dispenser 604 in the same manner as the plastics particles containing the heat conduction additives in the feeding hopper 611 of the first extruder 601.

Noticeably, operation is performed at the same time for delivering the plastics particles containing heat conduction additives and the plastics particles containing conductive additives respectively to the first branch line 630, the second branch line 631 and the third branch line 632.

Similar to the extruding process in the assembly line shown in FIG. 5, in FIG. 6 the first molten plastics containing heat conduction additives entering the first branch line 630 of the dispenser 604, the plastics containing conductive additives in the molten state entering the second branch line 631 of the dispenser 604 and the second molten plastics containing conductive additives entering the third branch line 632 of the dispenser converge at the outlet 633 of the dispenser to thereby superimpose together, and then enters the die cavity 635 of the die head 605 via the conduit 634 communicated with the outlet 633 of the dispenser so that the molten plastics is die pressed in the die cavity 635 to form a flat molten mass. The die pressed flat molten mass is delivered to between the forming rollers 610.1 and 610.2 to receive a stretching and pressing force applied by the forming rollers 610.1 and 610.2 thereto, to thereby form a sheet or film 100' with a predetermined thickness. The film 100' continued to be fed between the forming rollers 610.2 and 610.3 for further cooling or annealing to form the insulation film or sheet 100 according to one embodiment of the present invention. As needed, the die pressed flat molten mass outputted from the die head may run through only two forming rollers or more than two forming rollers to form the film.

The insulation film produced by the co-extruding process is of high quality, but the co-extruding process imposes high requirements for the apparatus. Therefore, the present invention further provides a method of producing the insulation film by a composite process, which imposes lower requirements for the apparatus.

Figure 7:
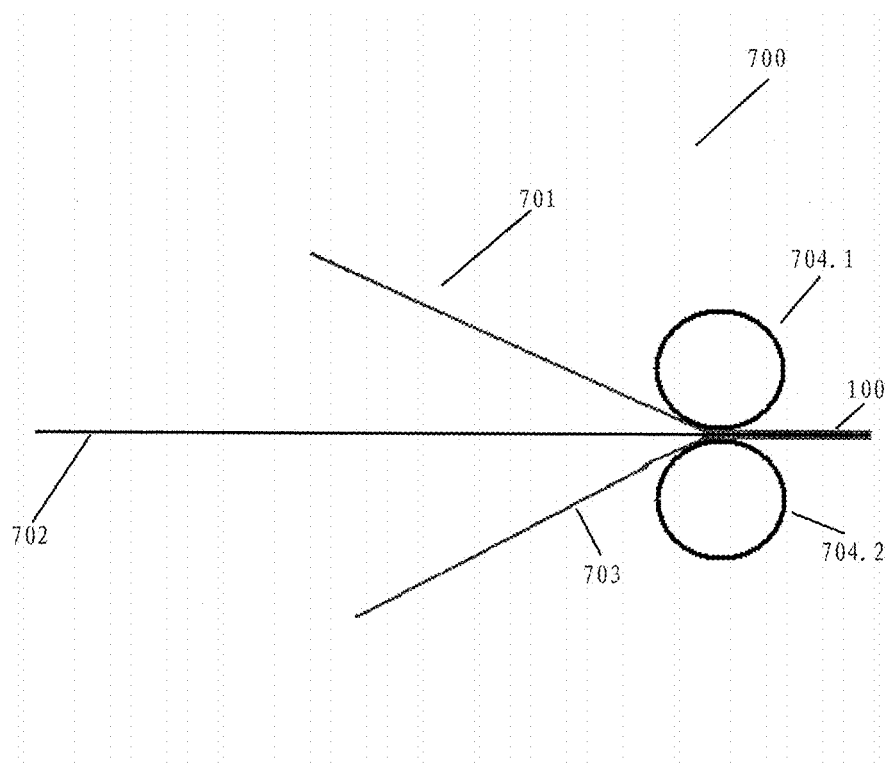
FIG. 7 is an exemplary view of a composite process for producing the insulation film according to an embodiment of the present invention.

FIG. 7 is a composite assembly line 700 of a composite process for producing the insulation film 100 according to an embodiment of the present invention, comprising a pair of pressing rollers 704.1 and 704.2. An upper layer 701, an intermediate layer 702 and a lower layer 703 of the insulation film 100 are respectively wound on three delivery rollers (not shown), and meanwhile inputted between the pressing rollers 704.1 and 704.2. When the pressing rollers 704.1 and 704.2 rotate relative to each other, a pulling force will be generated for the upper layer 701, the intermediate layer 702 and the lower layer 703 so that the delivery rollers are moved to release the upper layer 701, the intermediate layer 702 and the lower layer 703 respectively for the pressing rollers 704.1 and 704.2. As such, the upper layer 701, the intermediate layer 702 and the lower layer 703 are wound between and run through between the pressing rollers 704.1 and 704.2 so that the upper layer 701, the intermediate layer 702 and the lower layer 703 are pressed to form the insulation film 100.

In FIG. 7, the upper layer 701 and the lower layer 703 of the insulation film 100 is made of plastics material containing the heat conduction additives, and the intermediate layer 702 of the insulation film 100 is the plastics material containing conductive additives (such as carbon black, carbon fiber, metal powder, conducting polymer, etc.). After the upper layer 701, the intermediate layer 702 and the lower layer 703 of the insulation film 100 are released from respective delivery rollers and before they are wound between and run through the pressing rollers 704.1 and 704.2, a glue is applied to a lower surface of the upper layer 701 and/or an upper surface of the intermediate layer 702, and a glue is applied on a lower surface of the intermediate layer 702 and/or an upper surface of the lower layer 703 so that the upper layer 701, the intermediate layer 702 and the lower layer 703 of the insulation film 100 are, after being pressed by the pressing rollers 704.01 and 704.02, adhered together to form the insulation film 100.

Figure 8:
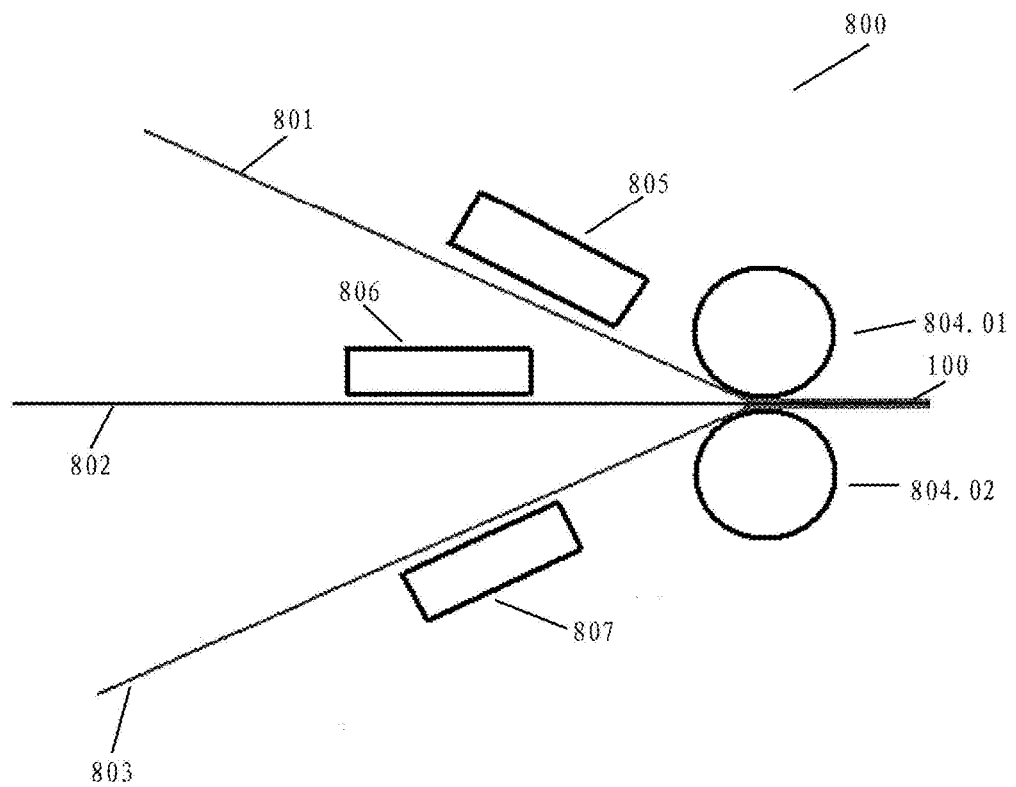
FIG. 8 is an exemplary view of a composite process for producing the insulation film according to an embodiment of the present invention.

FIG. 8 is another composite assembly line 800 of a composite process for producing the insulation film 100 according to an embodiment of the present invention. The composite assembly line 800 in FIG. 8 is similar to the composite assembly line 700 of FIG. 7. The only difference therebetween is that in FIG. 8, a baker 805, 806 and 807 is respectively provided on one side of a path from the respective delivery rollers for an upper layer 801, an intermediate layer 802 and a lower layer 803 of the insulation film 100 to between pressing rollers 804.01 and 804.02.

In FIG. 8, after the upper layer 801, the intermediate layer 802 and the lower layer 803 of the insulation film 100 are released from respective delivery rollers and before they are wound between and run through the pressing rollers 804.1 and 804.2, the upper layer 801, the intermediate layer 802 and the lower layer 803 of the insulation film 100 are heated by the respective bakers to soften them so that the upper layer 801, the intermediate layer 802 and the lower layer 803 of the softened insulation film 100 are, after being pressed by the pressing rollers 804.01 and 804.02, adhered together to form the insulation film 100.

Although FIG. 8 only illustrates a method of heating the upper layer 801, the intermediate layer 802 and the lower layer 803 of the insulation film via the bakers, those skilled in the art should appreciate that the upper layer 801, the intermediate layer 802 and the lower layer 803 are softened in other manners to soften them.

It should be noted that any one value in the ranges of the values indicated in the present application is applicable to the present invention.

The insulation film in the present invention can be available in the composite structure of an electrical device. Generally speaking, the electrical device comprises a housing, a metal sheet layer of shielding and heat dissipation, an insulation film, an electronic component surrounding (or partially surrounding) the metal sheet layer of shielding and heat dissipation inside the insulation film from outside to inside. The electronic component includes a printed circuit board, on which electronic elements and circuit parts are installed. The insulation film in the present invention can be disposed between the interior of the housing and the electrical component. With this structure, it is not necessary to dispose an else shielding interlayer (usually a metal sheet layer) between the interior of the housing and the electrical component (or the printed circuit board).

Figure 9:
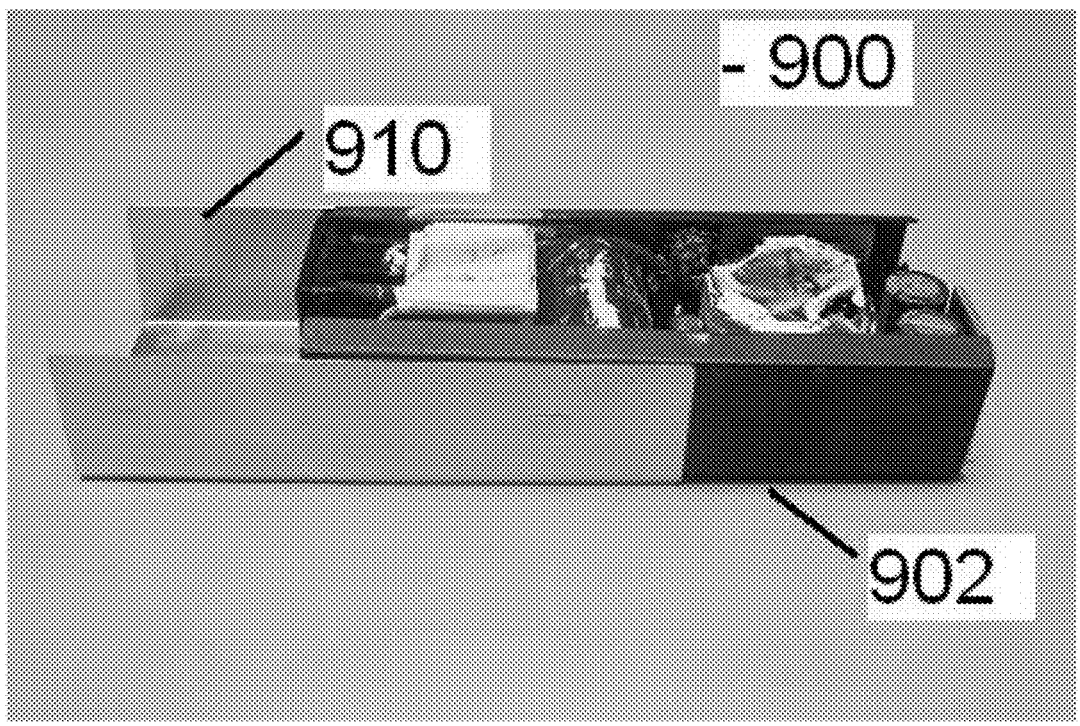
FIG. 9 illustrates a traditional structure of an electrical device (such as adapter) 900.

FIG. 9 illustrates the assembled structure of an electrical device (power adapter or power supply) 900. As shown in FIG. 9, the printed circuit board (not shown) is surrounded (or partially surrounded) by a traditional insulation film layer 902, while the traditional insulation film 902 is surrounded by a shielding interlayer (usually the metal sheet interlayer) 910, which has the function of preventing EMI (electromagnetic interference). The electronic elements and the circuit parts (such as resistors, capacitors, inductors, transistors, diodes, wires, pins, etc.) are installed on the printed circuit board. The printed circuit board surrounded by the traditional insulation film layer 902 and the shielding interlayer 910 is assembled within the housing.

Figure 10:
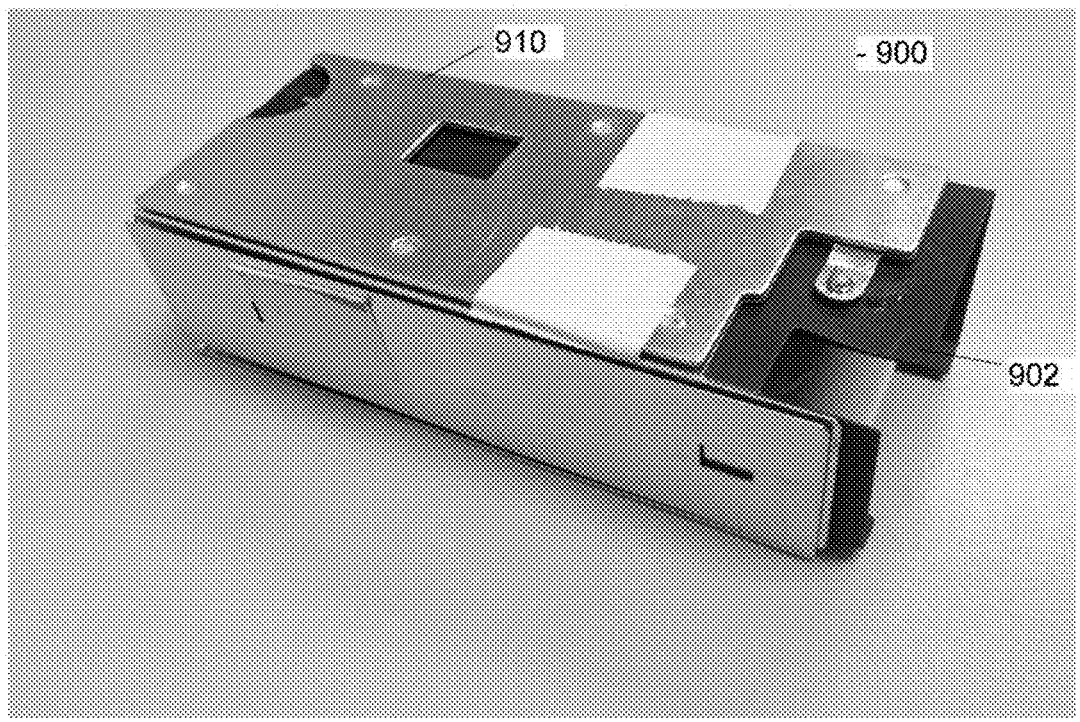
FIG. 10 illustrates the details of the structure of the electrical device (such as adapter).

FIG. 10 illustrates the details of the structure of a traditional electrical device. As shown in FIG. 10, the printed circuit board 102 is surrounded (or partially surrounded) by the traditional insulation film layer 902 and the shielding interlayer 910. It should be noted that any electrical device, the structure of which is similar to or the same as the assembled structure of the electrical device (power adapter or power supply) 900 illustrated in FIG. 9, can apply the insulation film 100, 200 in the present invention.

The shielding interlayer 910 in the electrical device 900 can be omitted when the traditional insulation film layer 902 is replaced by the insulation film in the present invention, for the reason that the insulation film has the function of preventing EMI (electromagnetic interference). Therefore, after the components of an electronic device are fully or partially wrapped by the insulation film of the present invention, the components, together with the print circuit board on which the components are installed, can be then installed within a housing (not shown) made of insulation material (such as plastic material) without needing the shielding interlayer 910 as shown in FIGS. 9 and 10.

Although the description illustrates, describes and points out novel features of the present invention applicable to preferred embodiments of the present invention, it should be appreciated that without departing from the spirit of the present invention, those skilled in the art may omit, substitute or change the form and details of the illustrated apparatus and its operation. For example, it is particularly noticeable that combinations of those elements and/or steps of the method for performing the substantially the same functions in substantively same manners to achieve the same result fall within the scope of the present invention. Besides, it should be appreciated that the forms disclosed in the present invention or structures and/or members and/or steps of the method shown and/or described in the embodiments might, as options of design, be combined into other forms or embodiments. Therefore, the scope of the present invention is limited to the scope as defined by the appended claims.

What is claimed is:

1. An insulation film, comprising:
a film upper layer and a film lower layer, wherein both of the film upper layer and film lower layer are made of a first plastics material, and the first plastics material contains a heat conduction additive;
a film intermediate layer located between the film upper layer and the film lower layer, wherein the film intermediate layer is made of a second plastics material selected from a group consisting of polycarbonate (PC), polyethylene terephthalate (PET), polypropylene (PP), and polyamide (PA), and the second plastics material contains a conductive additive,
wherein an upper surface of the film intermediate layer is bound together with a lower surface of the film upper layer, and wherein a lower surface of the film intermediate layer is bound together with an upper surface of the film lower layer.

2. An insulation film, comprising:
a film upper layer, wherein the film upper layer is made of a first plastics material selected from the group consisting of polycarbonate (PC), polyethylene terephthalate (PET), polypropylene (PP), and polyamide (PA), and the first plastics material contains a heat conduction additive selected from the group consisting of carborundum, boron nitride, and metal oxide; and
a film lower layer, wherein the film lower layer is made of a second plastics material selected from the group consisting of PC, PET, PP, and PA, and the plastics material contains conductive additives selected from the group consisting of carbon black carbon fiber, metal powder, and conducting polymer, wherein a lower surface of the film upper layer is bound together with an upper surface of the film lower layer.

3. An electronic component, comprising a printed circuit board, on which electronic elements and circuit parts are installed, the printed circuit board surrounded or partially surrounded by an insulation film, characterized in that the insulation film comprises:
a film upper layer and a film lower layer, wherein the film upper layer and the film lower layer are made of a first plastics material selected from a group consisting of polycarbonate (PC), polyethylene terephthalate (PET), polypropylene (PP), and polyamide (PA), and the first plastics material contains a heat conduction additive; and
a film intermediate layer located between the film upper layer and the film lower layer, wherein the film intermediate layer is made of a second plastics material and the second plastics material contains a conductive additive,
wherein an upper surface of the film intermediate layer is bound together with a lower surface of the film upper layer and a lower surface of the film intermediate layer is bound together with an upper surface of the film lower layer.

4. The electronic component according to claim 3, wherein the electronic component is used in an electronic device, wherein the electronic device comprises a housing, in which the electronic component is installed, the insulation film is located between the housing and the printed circuit board without other shielding interlayers located between the housing and the printed circuit board within the housing.

5. The electronic component according to claim 4, wherein the electronic component is an adapter.

6. The electronic component according to claim 4, wherein the electronic component is a power supply.

7. An electronic component, comprising a printed circuit board, on which electronic elements and circuit parts are installed, the printed circuit board surrounded or partially surrounded by an insulation film, characterized in that the insulation film comprises:
a film upper layer, wherein the film upper layer is made of a first plastics material and the first plastics material contains heat conduction additives; and
a film lower layer, wherein the film lower layer is made of a second plastics material selected from a group consisting of polycarbonate (PC), polyethylene terephthalate (PET), polypropylene (PP), and polyamide (PA), and wherein the second plastics material contains conductive additives,
wherein a lower surface of the film upper layer is bound together with an upper surface of the film lower layer.

8. The electronic component according to claim 7, wherein the electronic component is used in an electronic device, wherein the electronic device comprises a housing, in which the electronic component is installed, the insulation film is located between the housing and the printed circuit board without other shielding interlayers located between the housing and the printed circuit board within the housing.

9. The electronic component according to claim 8, wherein the electronic component is an adapter.

10. The electronic component according to claim 8, wherein the electronic component is a power supply.

* * * * *